US009964616B2

United States Patent
Cauley et al.

(10) Patent No.: US 9,964,616 B2
(45) Date of Patent: May 8, 2018

(54) FAST GROUP MATCHING FOR MAGNETIC RESONANCE FINGERPRINTING RECONSTRUCTION

(71) Applicants: Case Western Reserve University, Cleveland, OH (US); The General Hospital Corporation, Boston, MA (US)

(72) Inventors: Stephen Cauley, Cambridge, MA (US); Mark Griswold, Shaker Heights, OH (US); Kawin Setsompop, Charlestown, MA (US); Lawrence Wald, Cleveland, OH (US)

(73) Assignees: Case Western Reserve University, Cleveland, OH (US); The General Hospital Corporation, Boston, MA (US)

( * ) Notice: Subject to any disclaimer, the term of this patent is extended or adjusted under 35 U.S.C. 154(b) by 547 days.

(21) Appl. No.: 14/711,815

(22) Filed: May 14, 2015

(65) Prior Publication Data
US 2015/0346301 A1  Dec. 3, 2015

Related U.S. Application Data

(60) Provisional application No. 62/005,577, filed on May 30, 2014.

(51) Int. Cl.
*G01V 3/00* (2006.01)
*G01R 33/50* (2006.01)
*G01R 33/48* (2006.01)

(52) U.S. Cl.
CPC ......... *G01R 33/50* (2013.01); *G01R 33/4828* (2013.01)

(58) Field of Classification Search
CPC ............................ G01R 33/50; G01R 33/4828
See application file for complete search history.

(56) References Cited

U.S. PATENT DOCUMENTS

2012/0235678 A1\*  9/2012  Seiberlich ............ G01R 33/543
324/307
2016/0349341 A1\*  12/2016  Cohen ..................... A61B 5/055

OTHER PUBLICATIONS

Ma et al., Magnetic Resonance Fingerprinting, Nature 495, 187-192, 2013.\*
Petzschner et al., Fast MR Parameter Mapping Using k-t Principal Component Analysis, Magnetic Resonance in Medicine 66:706-716, 2011.\*

\* cited by examiner

*Primary Examiner* — Daniel Miller
(74) *Attorney, Agent, or Firm* — Quarles & Brady LLP

(57) ABSTRACT

Methods, apparatus, and other embodiments associated with producing a quantitative parameter map using magnetic resonance fingerprinting (MRF) are described. One example apparatus includes a data store that stores a grouped set of MRF signal evolutions, including a group representative signal and a low-rank representative, a set of logics that collects a received signal evolution from a tissue experiencing nuclear magnetic resonance (NMR) in response to an MRF excitation, a correlation logic that computes a correlation between a portion of the received signal evolution and a portion of a group representative signal, a pruning logic that generates a pruned grouped set, and a matching logic that determines matching quantitative parameters based on the received signal evolution and the low-rank representative.

25 Claims, 10 Drawing Sheets

FAST GROUP MATCHING FOR MAGNETIC RESONANCE FINGERPRINTING RECONSTRUCTION

CROSS REFERENCE TO RELATED APPLICATIONS

This application claims the benefit of U.S. Provisional Application 62/005,577 filed May 30, 2014.

STATEMENT REGARDING FEDERALLY SPONSORED RESEARCH

This invention was made with government support under EB012107 and MH093765 awarded by the National Institutes of Health. The government has certain rights in the invention.

BACKGROUND

Characterizing resonant species using nuclear magnetic resonance (NMR) can include identifying different properties of a resonant species (e.g., T1 spin-lattice relaxation, T2 spin-spin relaxation, proton density). Other properties of resonant species like tissue types and super-position of attributes can also be identified using NMR signals. NMR signals can be analyzed to determine an apparent diffusion coefficient from which a diffusion map may be produced. These properties and others may be identified simultaneously using magnetic resonance fingerprinting (MRF), which is described in *Magnetic Resonance Fingerprinting*, Ma D et al., Nature 2013:495, (7440):187-192 and in U.S. Pat. No. 8,723,518, which is incorporated herein by reference.

Conventional magnetic resonance (MR) pulse sequences include repetitive similar preparation phases, waiting phases, and acquisition phases that serially produce signals from which images can be made. The preparation phase determines when a signal can be acquired and determines the properties of the acquired signal. For example, a first pulse sequence may produce a T1-weighted signal at a first echo time (TE) while a second pulse sequence may produce a T2-weighted signal at a second TE. These conventional pulse sequences typically provide qualitative results where data are acquired with various weightings or contrasts that highlight a particular parameter (e.g., T1 relaxation, T2 relaxation).

When MR images are generated, they may be viewed by a radiologist or surgeon who interprets the qualitative images for specific disease signatures. The radiologist may examine multiple image types (e.g., T1-weighted, T2-weighted) acquired in multiple imaging planes to make a diagnosis. The radiologist or other individual examining the qualitative images may need particular skill to be able to assess changes from session to session, from machine to machine, and from machine configuration to machine configuration.

Unlike conventional magnetic resonance imaging (MRI), MRF employs a series of varied sequence blocks that simultaneously produce different signal evolutions in different resonant species (e.g., tissues) to which the RF is applied. The term "resonant species", as used herein, refers to an item (e.g., water, fat, tissue, material) that can be made to resonate using NMR. By way of illustration, when RF energy is applied to a volume that has both normal tissue and abnormal (e.g., cancerous) tissue, then both the normal tissue and abnormal tissue will produce an NMR signal. However the "normal tissue signal" and the "abnormal tissue signal" may be different and distinguishable using MRF. The different signals can be collected over a period of time to identify a signal evolution for the volume. Resonant species in the volume can then be characterized by comparing the signal evolution to known evolutions. Characterizing the resonant species may include identifying a material or tissue type, or may include identifying MR parameters associated with the resonant species. The "known" evolutions may be, for example, simulated evolutions or previously acquired evolutions. A large set of known evolutions may be stored in a comprehensive dictionary.

The data acquired with MRF techniques are compared with the dictionary of signal evolutions that have been generated for different acquisition parameters from magnetic resonance signal models, such as Bloch equation-based physics simulations or that have been collected from previous acquisitions. This comparison allows estimation of the MR parameters.

In order to limit the number of comparisons that need to be made, a dictionary of likely combinations is often created a priori. It is often necessary, however, for this dictionary to have between a hundred thousand to over a million dictionary elements in order to achieve a clinically acceptable resolution for the estimated tissue properties. Matching received signals to the dictionary is a computationally demanding problem. For instance, the process includes comparing a time course of signals from the subject, each having thousands of voxels, to upwards of one million dictionary elements, each having a thousand or more time points. As an example, using conventional approaches and hardware, it may take over three minutes to match the T1, T2, and B0 values for a 128×128 image matrix based on a dictionary having 200,000 elements that each include 1,000 time points. In other situations, matching may take five minutes or even longer, depending on the dictionary size, the number of time points, or the size of the image.

Compared to conventional MR methods, in which signals may have a real part upon which a pattern matching decision can be made, the MRF signal evolutions used by example methods and apparatus include complex values with an arbitrary phase relationship. These complex values with arbitrary phase relationships may result in correlated signal evolutions, and challenge the effectiveness of conventional matching approaches in a clinical environment.

BRIEF DESCRIPTION OF THE DRAWINGS

The accompanying drawings, which are incorporated in and constitute a part of the specification, illustrate various example apparatus, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
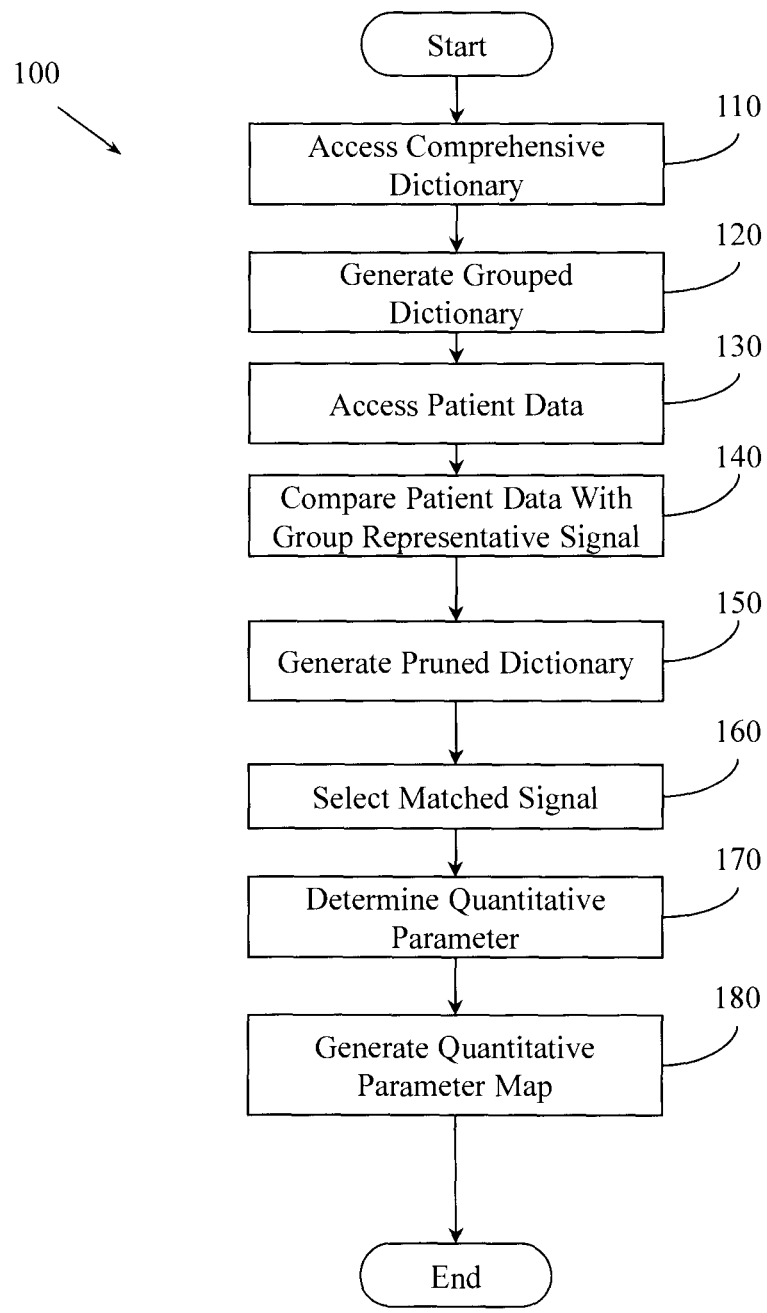
FIG. 1 illustrates an example method for producing a quantitative parameter map using MRF.

Example methods and apparatus improve on conventional MRF approaches by providing fast group matching for an MRI system using MRF. Data acquired with an MRI system from a patient is provided to example methods and apparatus. The acquired data represents a plurality of different signal evolutions acquired using different acquisition parameter settings. A complete dictionary that includes a plurality of predefined signals is also provided. A grouped dictionary is produced from the complete dictionary. The grouped dictionary includes groups of correlated elements (e.g., signal evolutions). A group includes at least one representative signal. Example methods and apparatus estimate quantitative parameters by comparing the acquired data with the representative signals in the group dictionary. Example methods and apparatus prune the complete dictionary, which is then employed for efficient matching. One or more quantitative parameter maps are then produced based on the estimated quantitative parameters.

Example methods and apparatus employ fast group matching (GRM) to improve the computational efficiency of the dictionary matching. Example methods and apparatus employing fast GRM improve on conventional approaches by leveraging techniques from discrete optimization and numerical linear algebra to reduce the time involved in matching acquired signals against a dictionary. In one embodiment, clustering techniques are employed to produce a compact, grouped MRF dictionary. This allows for efficient pruning of the MRF dictionary, where example methods and apparatus demonstrate up to a 99 percent reduction in the total number of comparisons used to match the acquired signals to the dictionary. In one embodiment, group principal component analysis (PCA) is used to evaluate the dictionary candidates still under consideration after the pruning procedure. The efficiency of the GRM technique is based in part on the inherent clustering properties found in Bloch simulations of standard tissue types.

MRF techniques employ a data acquisition scheme that causes signals from different materials or tissues to be spatially and temporally incoherent by continuously varying acquisition parameters throughout the data acquisition process. Examples of acquisition parameters that can be varied include echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, an amount by which a gradient is unbalanced when applied between an excitation portion of a sequence block and a readout portion of a sequence bock, a type of gradient applied between a readout portion of a sequence block and an excitation portion of a sequence block, a number of gradients applied between a readout portion of a sequence block and an excitation portion of a sequence block, an amount by which a gradient is unbalanced when applied between a readout portion of a sequence block and an excitation portion of a sequence bock, a type of gradient applied during a readout portion of a sequence block, a number of gradients applied during a readout portion of a sequence block, an amount of RF spoiling, an amount of gradient spoiling, an amount of time between sequence blocks in a series of variable sequence blocks, the relative amplitude of RF pulses in sequence blocks in a series of variable sequence blocks, and the relative phase of RF pulses in sequence blocks in a series of variable sequence blocks.

The acquisition parameters are varied in a random or pseudorandom manner. As a result of the spatial and temporal incoherence imparted by the acquisition scheme, different materials or tissues are associated with a unique signal evolution or "fingerprint," that is a function of multiple different physical parameters. The multiple different physical parameters may include longitudinal relaxation time (T1), transverse relaxation time (T2), main magnetic field map (B0), and proton density (ρ).

Quantitative parameter maps are generated from values for the physical parameters associated with the acquired signals. The values are retrieved after a comparison of the acquired signals to a predefined dictionary of signal evolutions. A dictionary is associated with different combinations of material, environmental, and acquisition parameters. The comparison of the acquired signals to a dictionary can be performed using suitable matching or pattern recognition techniques. Based on the comparison a signal vector may be selected. A signal vector may constitute a weighted combination of signal vectors from the dictionary that best corresponds to the acquired signal evolution. The selected signal vector is associated with values for multiple different quantitative parameters. The quantitative parameters may be retrieved using the selected signal vector and used to generate quantitative parameter maps. While a vector is described, the dictionary may store data in other forms.

Example methods and apparatus improve on conventional MRF by increasing the speed with which parameter maps are generated through use of the grouped dictionary. Example methods and apparatus out-perform conventional global PCA methods by orders of magnitude while maintaining similar accuracy to within 1-2% relative error. By increasing MRF matching speeds by at least an order of magnitude, example methods and apparatus produce the concrete, real-world, technical effect of reducing computing resources and electricity consumed while increasing the probability that at-risk patients receive timely treatment tailored to the particular pathology they exhibit. Example methods and apparatus thus improve on conventional methods in a measurable, clinically significant way.

MRF involves measuring pseudorandom MR signal evolutions produced in response to MRF pulse sequences. MRF also includes generating modeled signal evolutions that may be stored in a dictionary. The dictionary entries may be a function of several parameters. If the composition of the sample to be interrogated is known ahead of time, then a mathematical operation (e.g., weighted sum) of dictionary entries corresponding to the known components may be used to model signal evolutions and an inverse mathematical operation (e.g., matrix pseudo-inverse) may be used to compute the relative fraction of components assumed to be present based on a received signal evolution. Conventional approaches attempt to match received signal evolutions with the entire dictionary.

Example apparatus and methods use MRF to cause resonant species in an object to produce pseudorandom MR signal evolutions. Example methods and apparatus may be applied to cancer diagnosis and detection. In one embodiment, example apparatus and methods simultaneously measure T1 and T2 values of prostrate lesions and surrounding tissues (e.g., NPZ). In this example, T1 and T2 relaxometry values can be used to distinguish between prostate Ca and NPZ. In other embodiments, other types of pathological tissue, including brain cancer tissue, lung cancer tissue, or esophageal cancer tissue, may be distinguished. Additionally, T1 relaxometry values may be used to evaluate post biopsy effects due to hemorrhaging, scarring, or other effects. The pseudorandom signal evolutions may be compared to a grouped dictionary of stored signal evolutions. The comparison may be performed using, for example, an orthogonal matching pursuit (OMP) technique. (See, e.g., Doneva M, et al. MRM, 2010) The stored signal evolutions may be from previous acquisitions or may even be from theoretical models. For example, the stored signal evolutions can be from a set described by:

$$SE = \sum_{i=1}^{N_S} \sum_{i=1}^{N_A} \sum_{j=1}^{N_{RF}} R_{i(\alpha)} R_{RF_{ij}(\alpha,\phi)} R(G) E_i(T1, T2, \ldots) DPdM_0 \quad [1]$$

or $$SE = \sum_{i=1}^{N_S} \sum_{i=1}^{N_A} \sum_{j=1}^{N_{RF}} R_i(\alpha) R_{RF_{ij}(\alpha,\phi)} R(G) E_i(T1, T2, \ldots) DPdM_0 \quad [2]$$

where:
SE is a signal evolution, $N_S$ is a number of spins, $N_A$ is a number of sequence blocks, $N_{RF}$ is a number of RF pulses in a sequence block, $\alpha$ is a flip angle, $\phi$ is a phase angle, $Ri(\alpha)$ is a rotation due to off resonance, $R_{RF_{ij}}(\alpha,\phi)$ is a rotation due to RF differences, $R(G)$ is a rotation due to a gradient, T1 is spin-lattice relaxation, T2 is spin-spin relaxation, D is diffusion relaxation, Pd is proton density, $E_i(T1, T2, \ldots)$ is decay due to relaxation differences, and $M_0$ is the default or equilibrium magnetization. When matching received signal evolutions to the stored signal evolutions, example methods and apparatus may compare some or all of the parameters described above.

The stored signal evolutions may also include a signal selected from:

$$S_i = R_i E_i (S_{i-1}) \quad [3]$$

or $$S_i = R_i E_i \sum_{x=1}^{i-1} R_x E_x (S_x) \quad [4]$$

or $$S_i = R_i E_i \prod_{x=1}^{i-1} R_x E_x (S_x) \quad [5]$$

or $$S_i = \sum_{s=1}^{N_S} R_{s,i} E_{s,i} (S_{s,i-1}) \quad [6]$$

or $$S_i = \sum_{s=1}^{N_S} R_{s,i} E_{s,i} \sum_{x=1}^{i-1} R_{s,x} E_{s,x} (S_{s,x}) \quad [7]$$

or $$S_i = \sum_{s=1}^{N_S} R_{s,i} E_{s,i} \prod_{x=1}^{i-1} R_{s,x} E_{s,x} (S_{s,x}). \quad [8]$$

where:
$S_0$ is the default or equilibrium magnetization, $S_i$ is a vector that represents the different components of the magnetization Mx, My, Mz during acquisition block i, $R_i$ is the combination of rotational effects that occur during acquisition block i, and $E_i$ is the combination of effects that alter the amount of magnetization in the different states for acquisition block i. Equations 1-8 may be referred to in the specification and in the claims as the "MRF dictionary signal equations."

Some MRF investigations may involve a sample for which there is a priori knowledge about the resonant species that are likely to be encountered. The a priori knowledge may even include information concerning possible or expected ratios of the amounts of the resonant species to be encountered in the sample. When the sample has some properties (e.g., T1 relaxation time, T2 relaxation time) that are likely to fall in a certain range, then it may be possible to simplify or even focus the pattern matching portion of MRF. Example methods and apparatus may improve on conventional methods by using this property to group correlated signal evolutions in the grouped dictionary.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, calculating, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described.

Moreover, less than all the illustrated blocks may be required to implement an example methodology. Blocks may be combined or separated into multiple components. Furthermore, additional and/or alternative methodologies can employ additional, not illustrated blocks.

FIG. 1 illustrates a computerized method 100 for producing a quantitative parameter map using fast group matching (GRM). GRM improves on conventional MRF methods by leveraging techniques from discrete optimization and numerical linear algebra to take advantage of the correlated nature of dictionary elements. Method 100 includes, at 110, accessing a comprehensive dictionary of predicted MRF signal evolutions. The stored signal evolutions may be from previous acquisitions, may be derived from theoretical models, or may be a combination of previous acquisitions and theoretical models. A signal evolution in the dictionary includes complex values with an arbitrary phase relationship. In one embodiment, the stored signal evolutions are from a set described by the MRF dictionary signal equations.

Method 100 also includes, at 120, generating a grouped dictionary based on the comprehensive dictionary. The grouped dictionary includes a plurality of groups. In one embodiment, a group includes a plurality of correlated signal evolutions, a group representative signal that represents the group, and a group low-rank representative. A group representative signal may be generated by determining the mean signal across the group, or may be calculated using statistics-based estimations. In other embodiments, other techniques may be used to generate the group representative signal.

Method 100 also includes, at 130, accessing patient data. The patient data includes a patient MRF signal evolution. A patient MRF signal evolution includes complex values with an arbitrary phase relationship. The complex values with an arbitrary phase relationship of both the patient MRF signal evolution and the dictionary elements make conventional pattern matching techniques inefficient or inoperable in a clinically relevant timeframe. In one embodiment, patient data may be acquired from an MRI system performing MRF data acquisition. In another embodiment, patient data may be retrieved from previously acquired patient data stored on a non-transitory computer-readable storage medium. In still another embodiment, the patient data may be acquired from an MRI system and from previously acquired patient data.

Method 100 also includes, at 140, comparing the patient MRF signal evolution with group representative signals. In one embodiment, the number of groups under consideration are restricted to an integer greater than or equal to one. The number of groups under consideration may be a threshold number of groups less than the total number of groups. The threshold number of groups may be adapted automatically and dynamically, based on the results of current matching operations, changes in the grouped dictionary composition, changes in the acquired patient data, and for other reasons. Comparing the patient MRF signal evolution with a group representative signal allows for efficient pruning of groups from consideration. For example, if the patient MRF signal evolution obtained from a voxel cannot be matched to the representative signal for a group within a threshold percentage of a best option match, that group may be pruned from consideration and no longer searched for matching signal evolutions. In another embodiment, method 100, at 140, may consider the next best option, or a threshold number of next best options, and determine if a stable point has been reached.

Upon determining that the threshold number of group representative signals do not match the patient MRF signal evolution to within a desired threshold, method 100 also includes, at 150, generating a pruned dictionary. The pruned dictionary is generated by removing from consideration, from the grouped dictionary, the groups represented by the threshold number of representative signals that do not match the patient MRF signal evolution. By pruning groups and removing them from consideration, example methods and apparatus may accurately remove over ninety-nine percent of possible dictionary comparisons used to find matching quantitative parameters. Example methods and apparatus are an order of magnitude faster than conventional global PCA techniques, and two orders of magnitude faster than direct matching techniques, but with comparable accuracy with a 1% to 2% relative error. Example methods and apparatus thus provide a useful, tangible improvement over conventional approaches by increasing speed while maintaining accuracy.

In one embodiment, generating the pruned dictionary is a function of a pruning criterion. The pruning criterion may be determined through a relative correlation threshold or an absolute correlation threshold. The pruning criterion may be a dynamic, adaptive pruning criterion based, at least in part, on a dynamic best option correlation between the patient MRF signal evolution and a group representative signal evolution. The pruning criterion may also be based on the level of redundancy across the group representative signals in the grouped dictionary, the level of compression within groups in the pruned dictionary, or the level of compression within groups in the grouped dictionary. In one embodiment, where a relative pruning criterion is employed, the pruning criteria is a relative pruning criteria of $5 \times 10^{-3}$ below a best group match for the patient MRF signal evolution. In other embodiments, other pruning criteria may be employed.

One example of group matching is now described. After the acquisition of data from a subject at 130, an initial compact matching is performed against the representative group signals, $[S_1 \ldots S_N]$. This initial matching allows for efficient pruning of groups from consideration. For instance, if a voxel's signal evolution cannot be matched within a threshold criterion to the representative signal evolution for a threshold number of groups, the signals within these groups may no longer be considered as candidates. In different examples, the threshold criterion may be the amount of time spent matching, the number of representative signals compared, a threshold percentage difference from a best option, or a determination that a stable point has been reached after including a plurality of next best options. The pruning criteria can be determined through a relative or absolute correlation threshold. In this example, a relative pruning criteria of $5 \times 10^{-3}$ below the best group match for a voxel ensures a clinically useful final matching accuracy.

Method 100 also includes, at 160, selecting a matched signal evolution from the dictionary elements contained within groups under consideration. The matched signal evolution is selected by matching, to within a threshold quality of fit, the patient MRF signal evolution with a signal evolution in the pruned dictionary. In one embodiment, the matching is based on a group low-rank representative determined by a PCA of the pruned dictionary. In one example, the threshold quality of fit is a dynamic, adaptive threshold. In another example, other qualities of fit may be employed. In one embodiment, less than the entire patient MRF signal evolution is matched with less than the entire signal evolution in the pruned dictionary.

Method 100 also includes, at 170, determining a quantitative parameter for the patient MRF signal evolution based on the matched signal evolution. In one embodiment, method 100 includes identifying one or more MR parameters associated with a voxel that produced the patient MRF signal evolution based, at least in part, on the quantitative parameter. The MR parameters may include T1, T2, B0, or ρ. Method 100 also includes, at 180, generating a quantitative parameter map based, at least part, on the quantitative parameter.

Figure 10:
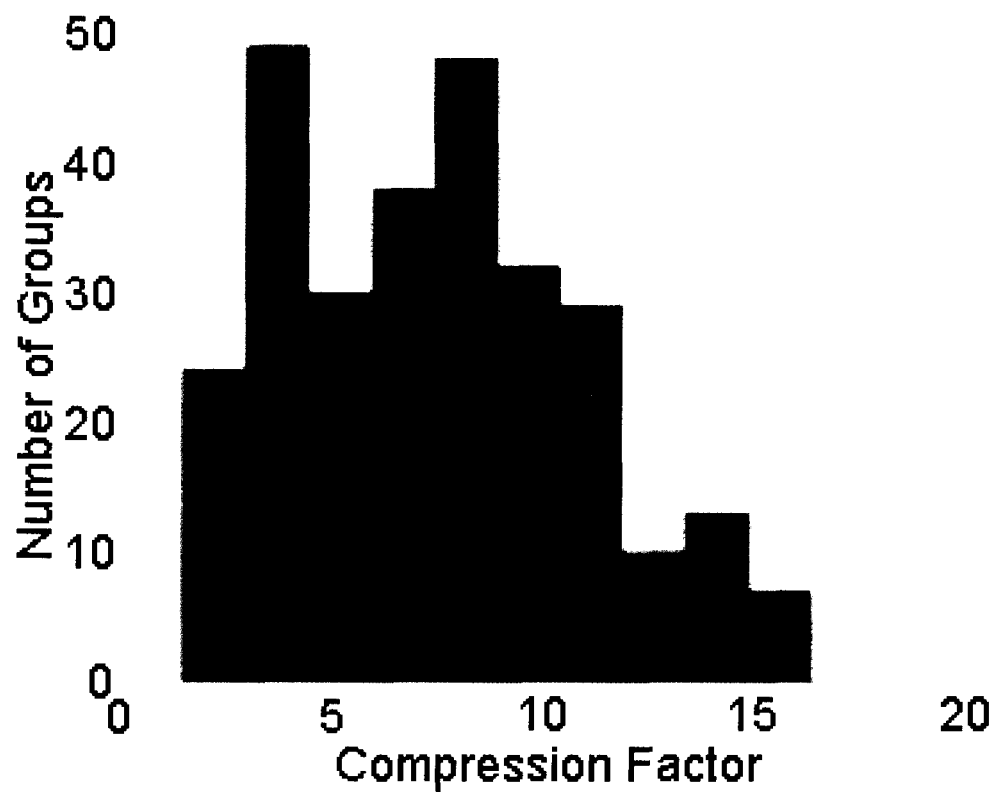
FIG. 10 is a plot illustrating compression rates achievable by example methods and apparatus.

Example methods and apparatus balance speed and accuracy when managing the condition number for the group mean signals (e.g., the representative signals) and the average PCA compression rate within the groups. While it may be possible to add more groups for early pruning, a lack of compression within the groups can lead to increased time for the final evaluation. In addition, the level of redundancy across the mean group signals may influence the pruning efficiency. In one embodiment, a condition number for the group mean signals matching the PCA truncation level of $10^{-5}$ results in clinically useful computational performance and reconstruction accuracy. FIG. 10 is a plot illustrating compression rates achievable by example methods and apparatus related to the number of groups.

Example methods and apparatus improve on conventional MRF approaches by reducing the complexity of many dictionary reconstruction and optimization problems for MRF. One improvement concerns forward modeling of the entire reconstruction and matching process, where the number of optimization variables can be computationally prohibitive. In one embodiment, a parallel imaging forward model is regularized through the addition of a sparsity constraint against the smaller number of group mean signals as opposed to the full dictionary. The sparsity across the group mean signals can be used to dynamically and adaptively guide the pruning stage of example methods and apparatus. Another embodiment may be employed to reduce the complexity associated with the optimization of MRF acquisition parameters including TR and flip angle. For example, with a fixed grouping scheme across the tissue properties, the strength of correlation between the group mean signals may be used to evaluate the quality of acquisition scenarios.

By improving the speed with which MRF may be accurately performed by orders of magnitude over conventional approaches, example methods and apparatus may conserve computing resources and electricity all while leading to a faster and more appropriately determined and applied treatment. Using a faster and more appropriately determined and applied treatment may lead to less therapeutics being required for a patient or may lead to avoiding or delaying a biopsy, a resection, or other invasive procedure. When regions of cancerous tissue are more quickly and more accurately classified, patients with more acute prognoses may receive a higher proportion of scarce resources (e.g., therapeutics, physician time and attention, hospital beds) while those with better prognoses may be spared unnecessary treatment, which in turn spares unnecessary expenditures and resource consumption. Example methods and apparatus may thus have the real-world, quantifiable effects of improving patient outcomes and reducing resource consumption.

While FIG. 1 illustrates various actions occurring in serial, it is to be appreciated that various actions illustrated in FIG. 1 could occur substantially in parallel. By way of illustration, a first process could access a comprehensive dictionary, a second process could generate a grouped dictionary, and a third process could access patient data. While three processes are described, it is to be appreciated that a greater or lesser number of processes could be employed and that lightweight processes, regular processes, threads, and other approaches could be employed.

Figure 2:
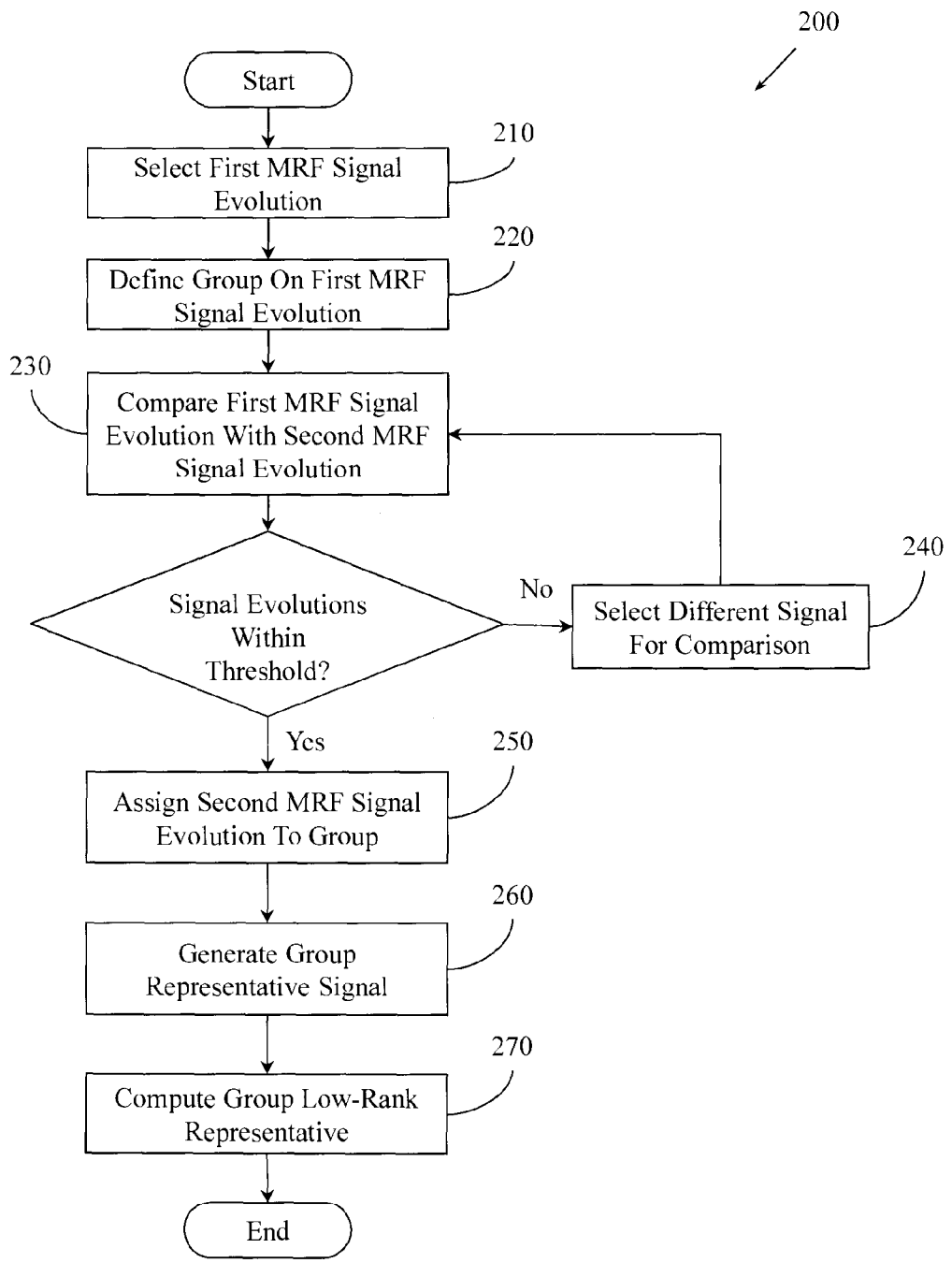
FIG. 2 illustrates an example method for generating a grouped dictionary.

FIG. 2 illustrates an example method 200 for generating a grouped dictionary for use in a fast group matching MRF system. In one embodiment, method 200 may take place during portion 120 of method 100. Method 200 includes, at 210, selecting a first MRF signal evolution from a comprehensive dictionary. In one embodiment, selecting the first MRF signal evolution from the comprehensive dictionary includes randomly selecting an MRF signal evolution from the comprehensive dictionary, or selecting a mean signal evolution for a tissue type represented in the comprehensive dictionary. In another embodiment, other approaches may be used to select the first MRF signal.

Method 200 also includes, at 220, defining a group based on the first MRF signal evolution. The group includes the first MRF signal evolution. A group may be defined using a threshold correlation value.

Method 200 also includes, at 230, comparing the first MRF signal evolution with a second, different MRF signal evolution selected from the comprehensive dictionary. Comparing the first MRF signal evolution with the second MRF signal evolution includes computing a correlation between the first MRF signal evolution and the second MRF signal evolution.

Method 200 also includes, at 240, upon determining that the second MRF signal evolution is not within a threshold correlation of the first MRF signal evolution, selecting a different MRF signal evolution from the comprehensive dictionary to compare with the first signal. In one embodiment, determining that the second MRF signal evolution is not within a threshold correlation of the first MRF signal evolution is a function of sparse methods including K-way partitioning, or greedy choice grouping. In one example, K-way partitioning repetitively solves minimum cut problems to sub-divide elements hierarchically. K-way partitioning may be employed for smaller data sets. In a k-way partitioning example, highly scalable greedy grouping schemes may be used for larger data sets. In other embodiments, other techniques may be employed to determine if the second MRF signal evolution is not within a threshold correlation of the first MRF signal evolution.

Method 200 also includes, at 250, upon determining that the second MRF signal evolution is within the threshold correlation of the first MRF signal evolution, assigning the second MRF signal evolution to the group. In one embodiment, determining that the second MRF signal evolution is within the threshold correlation of the first MRF signal evolution is a function of sparse methods including K-way partitioning, or greedy choice grouping. In another embodiment, the determination may be made using other statistical or pattern matching approaches.

Method 200 also includes, at 260 generating a group representative signal for the group. In one embodiment, generating the group representative signal for the group includes calculating the mean signal across the plurality of correlated signal evolutions in the group. In one embodiment, the group representative signal may be generated by calculating a statistics-based estimation from the plurality of correlated signal evolutions in the group. In one embodiment, outlying correlated signal evolutions may be excluded from the calculation of the mean signal. In some embodiments, the representative signals are used by example methods and apparatus to disqualify poorly matching groups from further matching consideration. Disqualifying poorly matching groups from further consideration reduces the computational resources used to complete the matching operation.

Method 200 also includes, at 270 computing a group low-rank representative for the group. In one embodiment, computing the group low-rank representative may be based, at least in part, on a PCA approach using singular value decomposition.

In one embodiment of method 200, the grouped dictionary includes all the elements of the comprehensive dictionary. In another embodiment, the grouped dictionary includes a subset of the elements of the comprehensive dictionary that contains less than all the elements of the comprehensive dictionary. The size of the subset is based, at least in part, on a stopping criterion. The stopping criterion may be, for example, a threshold number of grouped elements in the grouped dictionary. In one embodiment, when a threshold number of grouped elements are in the grouped dictionary, method 200 may terminate. The stopping criterion may be adjusted automatically and dynamically to adjust for changing computing resources, accuracy, clinical conditions, and other reasons. If additional grouping is desired, method 200 may select more ungrouped signal evolutions from the comprehensive dictionary, and repeat the grouping process. In another embodiment, the grouped dictionary includes a number M of MRF signal evolutions, where M is an integer greater than 1, and where the M MRF signal evolutions are evenly spread across a number N groups. In this case, N is an integer greater than 0. In still another embodiment, the grouped dictionary includes a number M of MRF signal evolutions, where M is an integer greater than 1. In this embodiment, the M MRF signal evolutions are spread unevenly across a number N groups, where N is an integer greater than 0. In other embodiments, the M MRF signal evolutions may be spread across the number N groups according to other distributions, including normal, binomial, trinomial, or other distributions.

Another example embodiment of method 200 is now described. First, an initial signal, $S_0$, is selected. The initial signal, $S_0$, can be selected as a random dictionary element, or the initial signal, $S_0$, can be selected as a mean signal for a particular tissue type, such as gray matter or white matter.

While there have been no dictionary elements assigned to groups, the initial signal $S_0$ is compared against all other dictionary elements. In another embodiment, the initial signal may be compared against a subset of the other dictionary elements. The number of comparisons may be dynamically altered. Based on a pre-determined group size (e.g., M/N), the top correlations to the initial signal $S_0$ are assigned to the first group. A new signal, $S_1$, is then created to best represent the time courses contained within the first group. In this context, the new signal is a representative signal of the group. This new, representative signal may be selected as the mean signal for the group. The representative signal allows for a faster evaluation of the average correlation of the acquired signal against all elements within a grouping, compared to conventional methods that would check all the elements, or a larger subset of all the elements. In some embodiments, less than the entire signal $S_0$ is compared against the dictionary elements. The fraction of the signal $S_0$ that is compared may be automatically and dynamically varied.

Example methods and apparatus may also compute a smaller group level PCA using singular value decomposition. This group PCA may be used as part of the matching process. PCA is effective on these group signals because the groups were chosen based on strength of correlation, or on linear dependence.

The high correlation property used to group the dictionary elements results in increased compression factors when compared to a global PCA based approach. Example methods and apparatus achieve compression factors from 1 to 15, depending on the number of groups. For example, the compression rates on 280 groups that contain over 196,000 dictionary elements range from a compression rate of 1 when at least 20 groups are used, to at least 15 when approximately 10 groups are used. The PCA compression performed on the signals contained in each group correspond to a conservative truncation tolerance of $10^{-5}$, which ensures matching accuracy for the final comparison against the signals from the imaging voxels. In other embodiments, different truncation tolerances may be used. FIG. 10 plots compression rates achievable using example methods and apparatus.

In one example, a method may be implemented as computer executable instructions. Thus, in one example, a non-transitory computer-readable storage medium may store computer executable instructions that if executed by a machine (e.g., computer) cause the machine to perform methods described or claimed herein including method 100, method 200, and method 300. While executable instructions associated with the listed methods are described as being stored on a computer-readable storage medium, it is to be appreciated that executable instructions associated with other example methods described or claimed herein may also be stored on a computer-readable storage medium. In different embodiments, the example methods described herein may be triggered in different ways. In one embodiment, a method may be triggered manually by a user. In another example, a method may be triggered automatically.

Figure 3:
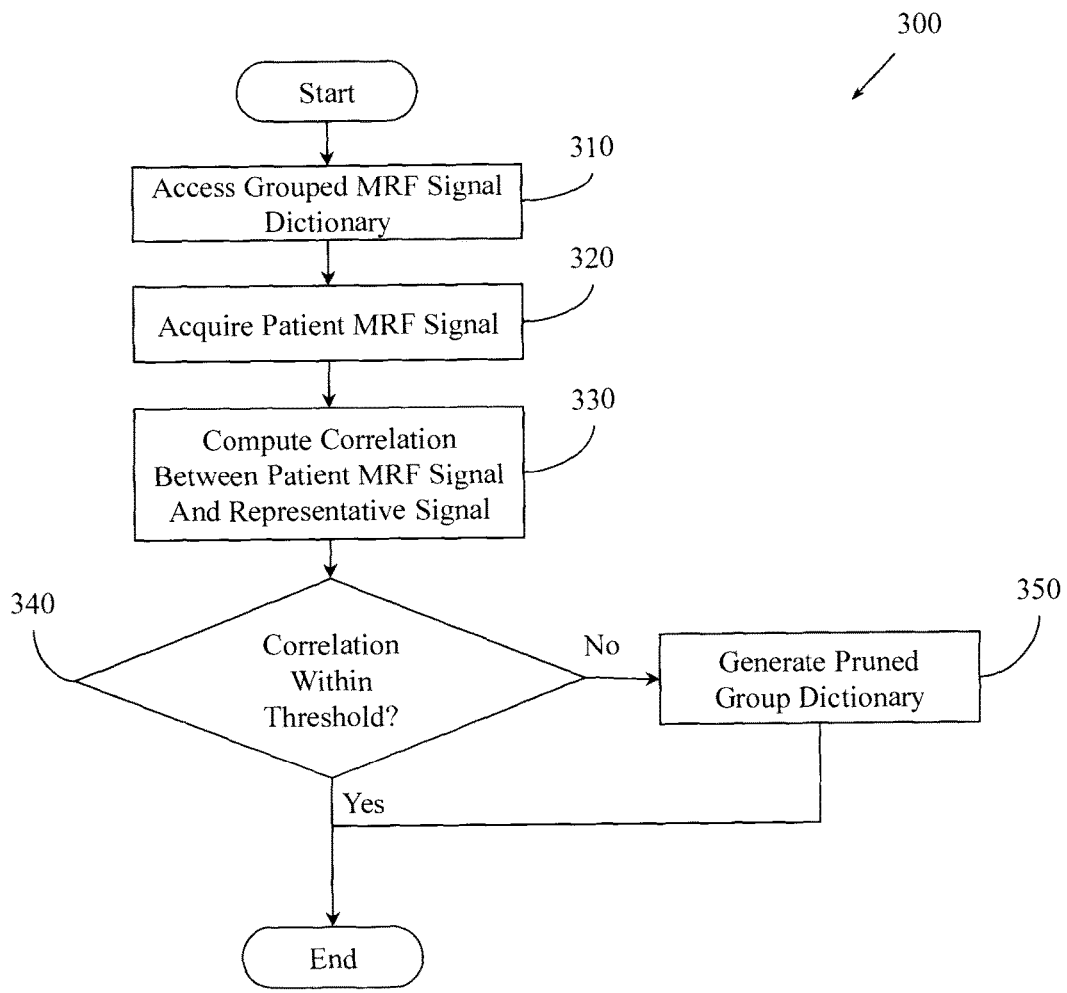
FIG. 3 illustrates an example method of generating a pruned dictionary using MRF.

FIG. 3 illustrates an example method 300 for pruning a dictionary for use with MRF. Method 300 includes, at 310, accessing a grouped MRF signal dictionary, where a group in the grouped MRF signal dictionary includes a plurality of MRF signals having a threshold correlation. The group also includes a representative signal, and a low-rank representative. The low-rank representative may be computed from a PCA of the MRF signals in the group.

Method 300 also includes, at 320, acquiring a patient MRF signal from an MRF apparatus that repetitively and variably samples a space associated with human tissue to produce the MRF signal. The patient MRF signal may include complex values with an arbitrary phase relationship. The patient MRF signal may have a form like that described in the MRF dictionary signal equations.

Method 300 also includes, at 330, computing a correlation between the patient MRF signal and a representative signal. Method 300 may, at 330, perform an initial compact matching between the patient MRF signal and a threshold number of representative signals. Compared to conventional MR methods, in which signals may have a real part upon which a pattern matching decision can be made, the MRF signal evolutions used by example methods and apparatus include complex values with an arbitrary phase relationship. These complex values with arbitrary phase relationships prevent the generation of orthogonal signals, which challenges conventional matching approaches in a clinical environment.

Method 300 also includes, at 340, determining that the correlation between the patient MRF signal and the representative signal is not within a threshold correlation. The correlation may be based on a comparison of the entire patient MRF signal with an entire representative signal. The correlation may also be based on a comparison of a dynamically variable fraction of the patient MRF signal with a corresponding dynamically variable fraction of the representative signal.

Method 300 also includes, at 350, upon determining that the correlation between the patient MRF signal and the representative signal is not within a threshold correlation, removing the group associated with the representative signal from consideration. By removing the group associated with the representative signal from consideration, method 300 generates a pruned group dictionary. In one embodiment, generating the pruned group dictionary includes computing a correlation between the patient MRF signal and a threshold number of representative signals, where the threshold number of representative signals is greater than one. Upon determining that the correlation between patient MRF signal and the threshold number of representative signals is not within a threshold correlation, method 300 generates a pruned group dictionary by removing from consideration the groups associated with the threshold number of representative signals from the grouped MRF signal dictionary.

In one embodiment, method 300 may automatically dynamically adapt the threshold correlation. Method 300 may adapt the threshold correlation based, at least in part, on the distribution of MRF signals in the grouped MRF signal dictionary. The threshold correlation may also be adapted base on the distribution of signals in the pruned group dictionary, the number of groups in the grouped MRF dictionary, the number of groups in the pruned group dictionary, the redundancy across the representative signals in the grouped MRF dictionary, the level of compression within groups in the grouped MRF dictionary, or the number of representative signals already compared with the patient MRF signal. In other embodiments, the threshold correlation may be adapted based on other considerations.

Figure 4:
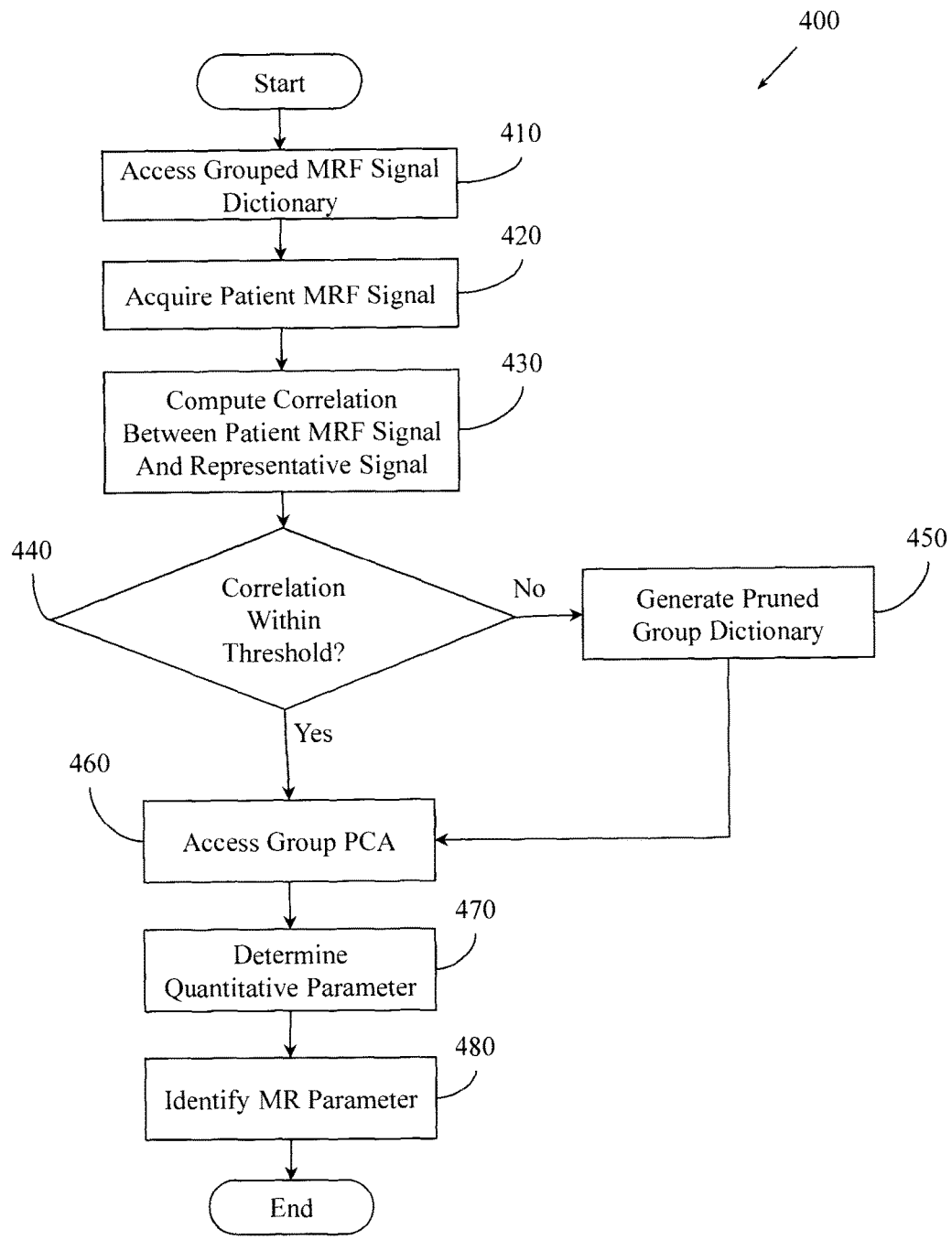
FIG. 4 illustrates an example method for determining quantitative parameters using MRF.

FIG. 4 illustrates an example method 400 for identifying an MR parameter based on signals acquired using MRF. Method 400 is similar to method 300, but includes additional actions 460, 470, and 480. Method 400 includes, at 460, accessing a PCA projection of the pruned group dictionary. Accessing the PCA projection may include comparing the patient MRF signal with the low-rank representation for the groups remaining in the pruned group dictionary.

Method 400 also includes, at 470, determining a quantitative parameter. Method 400 determines the quantitative parameter based, at least in part, on the PCA projection. Method 400 determines the quantitative parameter by comparing the patient MRF signal with MRF signals in the pruned group dictionary that match the patient MRF signal to within a threshold. Method 400 may compare the entire patient MRF signal with the MRF signals in the pruned group, or method 400 may compare less than the entire patient MRF signal with the MRF signals in the pruned group.

Method 400 also includes, at 480, identifying one or more MR parameters associated with the sampled space that produced the patient MRF signal. The one or more MR parameters are identified based, at least in part, on the quantitative parameter determined at 470. In one embodiment, method 400 also produces a quantitative parameter map based on the one or more identified MR parameters.

Figure 5:
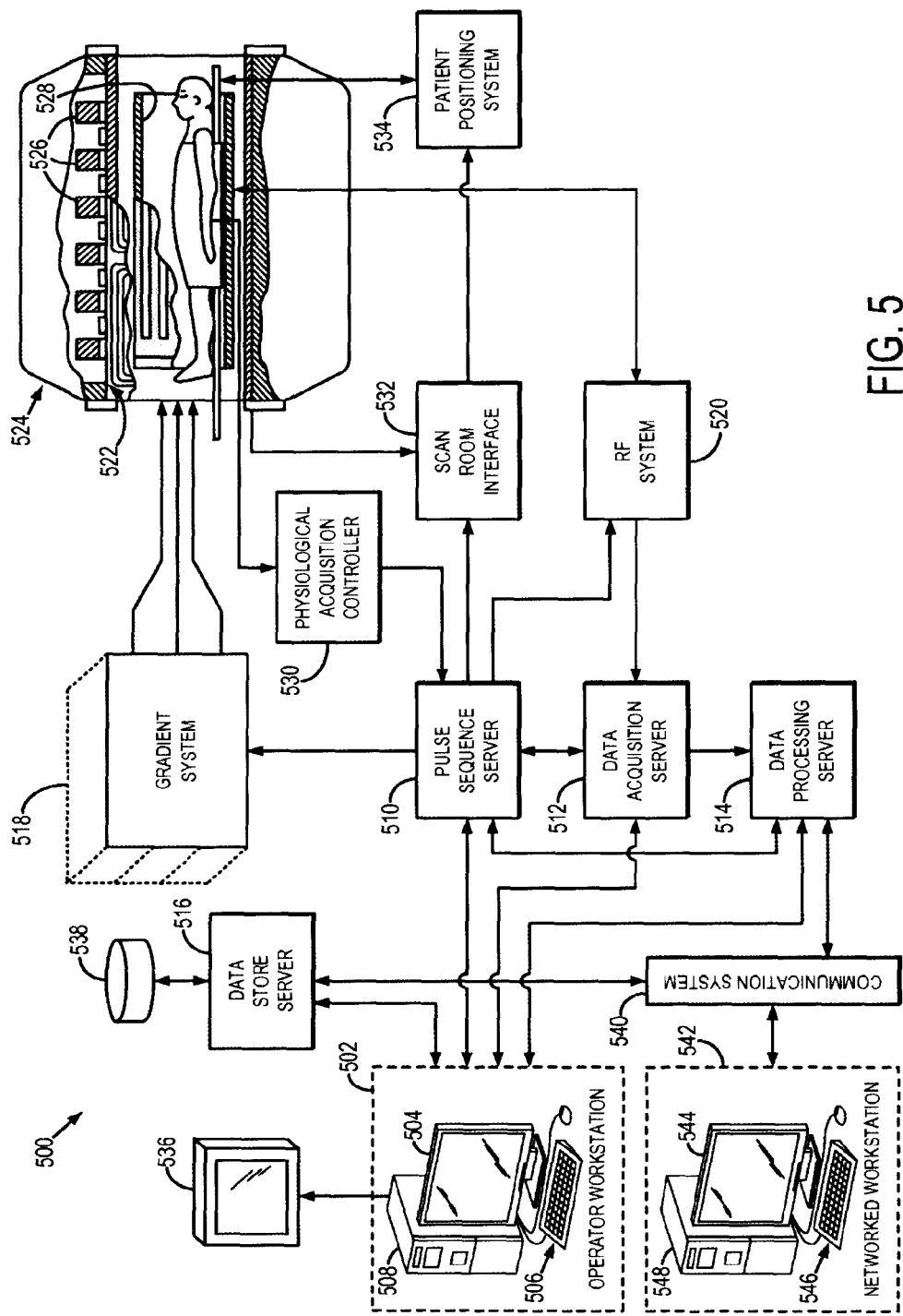
FIG. 5 illustrates an example MRI system in which example methods and apparatus may operate.

FIG. 5 illustrates an example MRI system in which example methods and apparatus may be employed. MRI system 500 includes an operator workstation 502, which includes a display 504, one or more input devices 506, including a keyboard, a mouse, or other input device, and a processor 508. In one embodiment, processor 508 may include a commercially available programmable machine running a commercially available operating system. Operator workstation 502 provides the operator interface that facilitates entering scan prescriptions into the MRI system 500. In one embodiment, operator workstation 502 may be coupled to four servers: a pulse sequence server 510; a data acquisition server 512; a data processing server 514; and a data store server 516. Other numbers of servers may be employed. The operator workstation 502 and servers 510, 512, 514, and 516 are connected to communicate with each other. For example, the servers 510, 512, 514, and 516 may be connected via a communication system 540, which may include suitable network connections, whether wired, wireless, or a combination of both. In one embodiment, the communication system 540 may include both proprietary or dedicated networks, as well as open networks, such as the internet. In other embodiments, different numbers of servers may be employed.

Pulse sequence server 510 functions in response to instructions downloaded from the operator workstation 502 to operate a gradient system 518 and an RF system 520. Gradient waveforms used to perform the prescribed scan are produced and applied to the gradient system 518, which excites gradient coils in an assembly 522 to produce the magnetic field gradients $G_x$, $G_y$, and $G_z$, used for position encoding magnetic resonance signals. Gradient coil assembly 522 forms part of a magnet assembly 524 that includes a polarizing magnet 526 and a whole-body RF coil 528.

RF waveforms are applied by the RF system 520 to the RF coil 528, or a separate local coil to perform the prescribed magnetic resonance pulse sequence. Responsive magnetic resonance signals detected by the RF coil 528, or a separate local coil are received by the RF system 520. RF system 520 amplifies, demodulates, filters, and digitizes the responsive MR signals under direction of commands produced by the pulse sequence server 510. RF system 520 includes an RF transmitter for producing a wide variety of RF pulses used in MRI pulse sequences. The RF transmitter is responsive to the scan prescription and direction from the pulse sequence server 510 to produce RF pulses of the desired frequency, phase, and pulse amplitude waveform. The generated RF pulses may be applied to the whole-body RF coil 528 or to one or more local coils or coil arrays.

The RF system 520 also includes one or more RF receiver channels. RF receiver channels include an RF preamplifier that amplifies the magnetic resonance signal received by the coil 528 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components: $M=\sqrt{I^2+Q^2}$. The phase of the received magnetic resonance signal may also be determined according to:

$$\varphi = \tan^{-1}\left(\frac{Q}{I}\right).$$

Pulse sequence server 510 also receives patient data from a physiological acquisition controller 530. In one embodiment, the physiological acquisition controller 530 receives signals from a plurality of different sensors connected to the patient, including electrocardiograph (ECG) signals from electrodes, or respiratory signals from a respiratory bellows or other respiratory monitoring device. These signals may be used by the pulse sequence server 510 to synchronize, or gate, the performance of the scan with the subject's heart beat or respiration.

Pulse sequence server 510 also connects to a scan room interface circuit 532 that receives signals from various sensors associated with the condition of the patient and the magnet system. It is also through the scan room interface circuit 532 that a patient positioning system 534 receives commands to move the patient to desired positions during the scan.

The digitized magnetic resonance signal samples produced by the RF system 520 are received by the data acquisition server 512. The data acquisition server 512 operates in response to instructions downloaded from the operator workstation 502 to receive the real-time magnetic resonance data and provide buffer storage, so that data loss caused by data overrun is minimized. In some scans, the data acquisition server 512 passes the acquired magnetic resonance data to the data processor server 514. However, in scans that require information derived from acquired magnetic resonance data to control the further performance of the scan, the data acquisition server 512 is programmed to produce such information and convey it to the pulse sequence server 510. For example, during pre-scans, magnetic resonance data is acquired and used to calibrate the pulse sequence performed by the pulse sequence server 510. In another embodiment, navigator signals may be acquired and used to adjust the operating parameters of RF system 520 or gradient system 518, or to control the view order in which k-space is sampled. In still another embodiment, data acquisition server 512 may also be employed to process magnetic resonance signals used to detect the arrival of a contrast agent in a magnetic resonance angiography (MRA) scan. In one embodiment, data acquisition server 512 acquires magnetic resonance data and processes it in real-time to produce information that is used to control the scan.

Data processing server 514 receives magnetic resonance data from the data acquisition server 512 and processes it in accordance with instructions downloaded from the operator workstation 502. The processing may include, for example, reconstructing two-dimensional or three-dimensional images by performing a Fourier transformation of raw k-space data, performing other image reconstruction algorithms (e.g., iterative or back-projection reconstruction), applying filters to raw k-space data or to reconstructed images, generating functional magnetic resonance images, calculating motion or flow images, or other processing. In other embodiments, data processing server 514 may process the data in other ways.

Images reconstructed by the data processing server 514 are conveyed back to the operator workstation 502 and stored. Real-time images are stored in a data base memory cache from which they may be output to operator display 512 or a display 536 for use by physicians or other operators. Batch mode images or selected real time images are stored in a host database on disc storage 538. When images have been reconstructed and transferred to storage, data processing server 514 notifies data store server 516 on operator workstation 502. Operator workstation 502 may be used by an operator to archive the images, produce films, or send the images via a network to other facilities.

MRI system 500 may also include one or more networked workstations 542. A networked workstation 542 may include a display 544, one or more input devices 546, including a keyboard, a mouse, or other input devices, and a processor 548. The networked workstation 542 may be located within the same facility as the operator workstation 502, or in a different facility, such as a different healthcare institution or clinic.

Networked workstation 542 may gain remote access to the data processing server 514 or data store server 516 via communication system 540. Multiple networked workstations 542 may have access to data processing server 514 and data store server 516. In this manner, magnetic resonance data, reconstructed images, or other data may be exchanged between data processing server 514 or data store server 516 and the networked workstations 542, so that the data or images may be remotely processed by a networked workstation 542. This data may be exchanged in suitable formats including, for example, the transmission control protocol (TCP), the internet protocol (IP), or other protocols.

Figure 6:
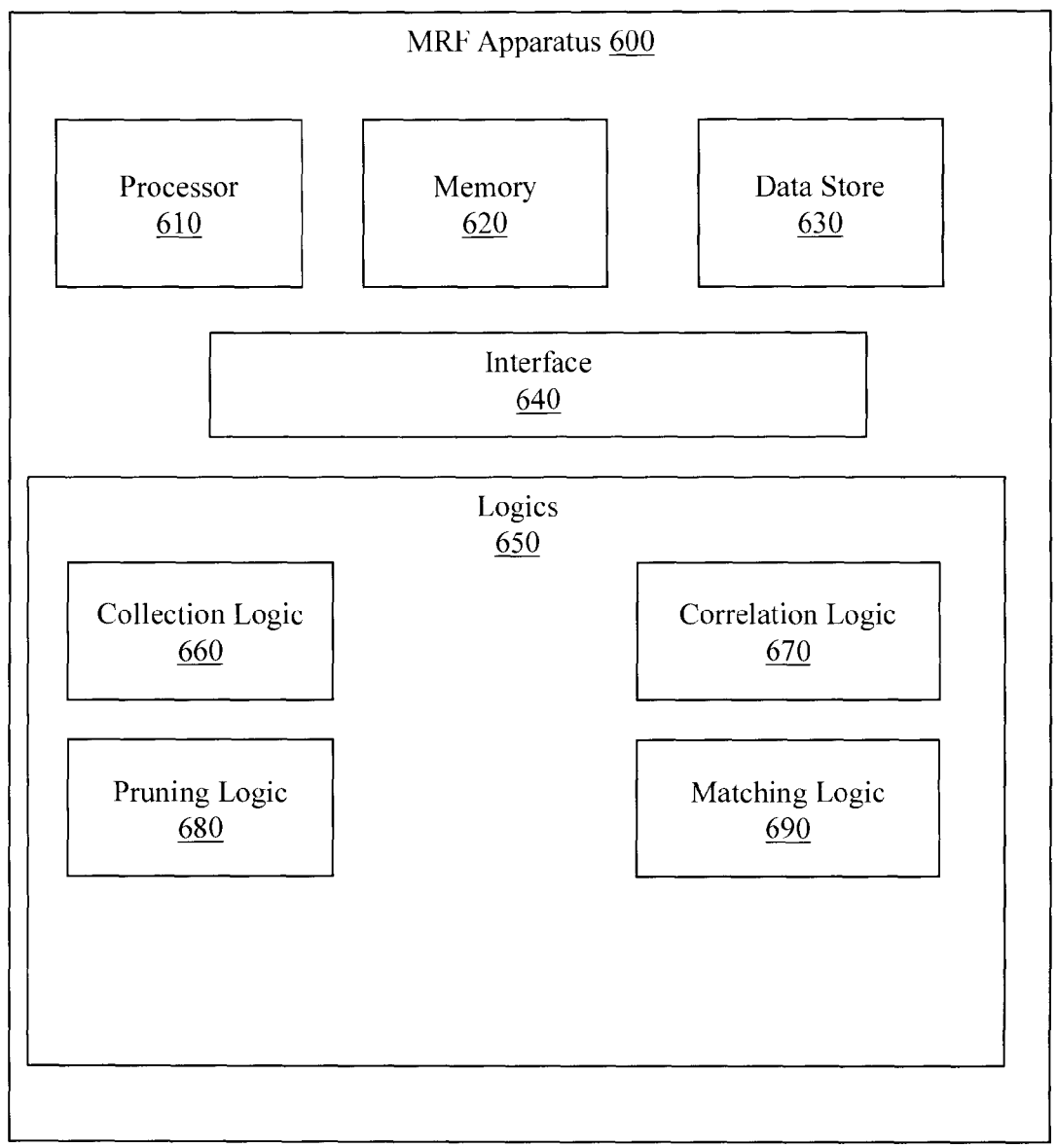
FIG. 6 illustrates an example apparatus for fast group matching for MRF.

FIG. 6 illustrates an example apparatus 600 that performs fast group matching for MRF. Apparatus 600 includes a processor 610, a memory 620, a data store 630, a set of logics 650, and an interface 640 that connects the processor 610, the memory 620, the data store 630, and the set of logics 650. The set of logics 650 includes a collection logic 660, a correlation logic 670, a pruning logic 680, and a matching logic 690. In one embodiment, the functionality associated with the set of logics 650 may be performed, at least in part, by hardware logic components. The hardware logic components may include but are not limited to, field-programmable gate arrays (FPGAs), application specific integrated circuits (ASICs), application specific standard products (ASSPs), system on a chip systems (SOCs), or complex programmable logic devices (CPLDs). In one embodiment, individual members of the set of logics 640 are implemented as ASICs or SOCs.

Data store 630 stores a grouped set of MRF signal evolutions. The grouped set includes a plurality of groups of MRF signal evolutions. A member of the plurality of groups includes a set of correlated MRF signal evolutions, a group-representative signal, and a low-rank representative. The MRF signal evolutions may have the form of those described in the MRF dictionary signal equations.

Collection logic 660 collects a received signal evolution from a tissue experiencing NMR in response to an MRF excitation applied to the tissue by an MRI apparatus. The received signal evolution includes a patient MRF signal evolution. The received signal evolution includes complex values with an arbitrary phase relationship. In one embodiment, the received signal evolution may be acquired from an MRI system performing MRF data acquisition. In another embodiment, the received signal evolution may be retrieved from previously acquired signal evolutions stored on a non-transitory computer-readable storage medium. In still another embodiment, the received signal evolution may be acquired from both an MRI system and from previously acquired received signal evolutions. The received signal evolution may have a form like that described in the MRF signal dictionary equations.

Correlation logic 670 computes a first correlation between a first portion of the received signal evolution and a first portion of a group representative signal. The first portion of the received signal may include all, or less than all, of the received signal evolution. The first portion of the group representative signal may include all, or less than all, of the group representative signal. For example, correlation logic 670 may compute a first correlation between the first half of the received signal evolution and the first half of the group representative signal. The size of the first portion of the received signal evolution and the size of the first portion of the group representative signal may be varied automatically and dynamically. In one embodiment, correlation logic 670 compares the received signal evolution to a threshold number of group representative signals. The threshold number of signals compared to the received signal evolution may be varied automatically and dynamically.

Pruning logic 680 generates a pruned grouped set. Upon determining that the correlation between the first portion of the received signal evolution and the first portion of a group representative signal is not within a threshold correlation level, pruning logic 680 removes the group associated with the group representative signal from the grouped set. The pruned grouped set is generated by removing, from the grouped set, the groups represented by the threshold number of representative signals that do not meet the threshold correlation with the received signal evolution.

In one embodiment, pruning logic 680 generates the pruned group set as a function of a pruning criterion. The pruning criterion may be determined through a relative correlation threshold or an absolute correlation threshold. The pruning criterion may be a dynamic, adaptive pruning criterion based, at least in part, on a dynamic best option correlation between the received signal evolution and a group representative signal evolution. The pruning criterion may also be based on the level of redundancy across the group representative signals in the grouped set, the level of compression within groups in the pruned grouped set, or the level of compression within groups in the grouped set. In one embodiment, where a relative pruning criterion is employed, the pruning criteria is a relative pruning criteria of $5\times10^{-3}$ below a best group match for the received signal evolution. In other embodiments, pruning logic 680 may employ other pruning criteria.

Matching logic 690 determines matching quantitative parameters by applying a PCA-based projection to the pruned grouped set based on the received signal evolution and the low-rank representative. In one embodiment, the quantitative parameters include T1, T2, B0, or proton density.

In one embodiment of apparatus 600, collection logic 660, correlation logic 670, pruning logic 680, and matching logic 690 are field-programmable gate arrays (FPGAs), application specific integrated circuits (ASICs), application specific standard products (ASSPs), system on a chip systems (SOCs), or complex programmable logic devices (CPLDs). In another embodiment, collection logic 660, correlation logic 670, pruning logic 680, and matching logic 690 may be other types of systems or circuits.

In one embodiment of apparatus 600, the set of logics 650 also includes a display logic. The display logic may control an MRI system to display the parameter map on a computer monitor, a smartphone display, a tablet display, or other displays. Displaying the parameter map may also include printing the parameter map. The display logic may also control the MRI system to display an image of the region of tissue demonstrating cancerous pathology. By displaying the parameter map and the image of the region of tissue under examination, example apparatus provide a timely and intuitive way for a physician, pathologist, or other operator, to more accurately predict prognoses for pathologies demonstrated by a patient, thus improving on conventional approaches for MRF.

Figure 7:
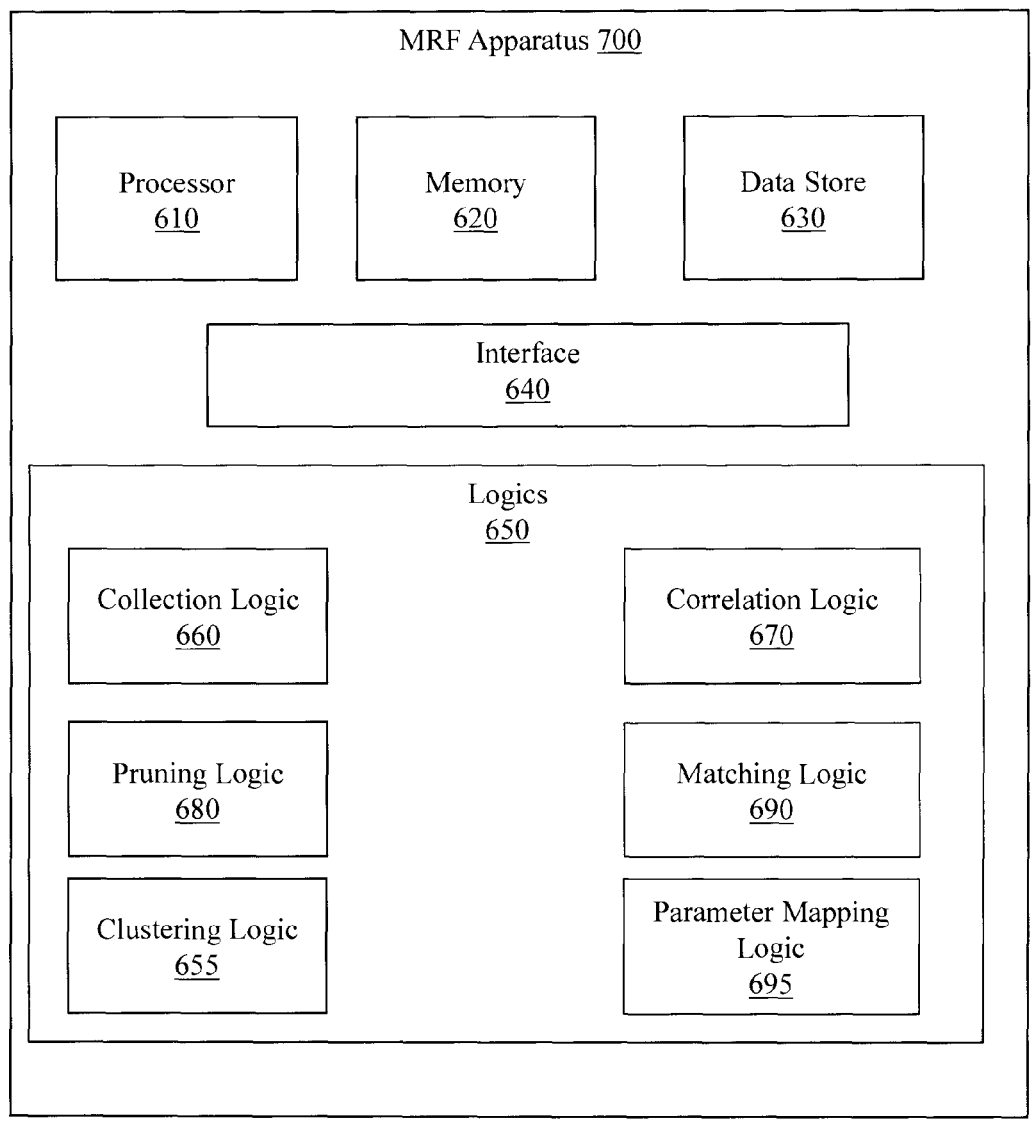
FIG. 7 illustrates an example apparatus for fast group matching for MRF.

FIG. 7 illustrates an example MR apparatus 700 that is similar to apparatus 600. Apparatus 700 includes clustering logic 655 and parameter mapping logic 695 in the set of logics 650. Clustering logic 655 accesses a set of signal evolutions. The set of signal evolutions may be previously acquired signal evolutions stored in a dictionary or other collection of signal evolutions, or may be theoretical constructs stored in the dictionary or other collection of signal evolutions. The signal evolutions may have the form of evolutions like those described by the MRF dictionary signal equations. The dictionary may be stored in the data store 630. The dictionary may be a logical construct that is implemented using various physical data structures including, but not limited to, database tables, lists, linked lists, arrays, maps, and self-organizing maps. Clustering logic 655 computes a correlation strength between the signal evolutions. Clustering logic 655 clusters, within a group, signal evolutions based on the correlation strength. For example, signal evolutions that have a correlation strength outside a threshold correlation may not be assigned to the group, while signal evolutions that are within a threshold correlation may be assigned to the group. Clustering logic 655 also calculates a representative signal for the group and assigns the representative signal to the group. The representative signal may be calculated as a mean of the signal evolutions within the group. Clustering logic 655 may discard outlier signal evolutions in the group when calculating the representative signal. Clustering logic 655 also computes a low-rank representative for the group. In one embodiment, clustering logic 655 calculates the representative signal for the group using sparse methods or a greedy choice method. Clustering logic 655 may also determine that a sufficient number of grouped elements are in the grouped set. In one embodiment, clustering logic 655 may determine that a stable point has been met, based upon a convergence criterion, when determining whether a sufficient number of grouped elements have been grouped.

In one embodiment, correlation logic 670 computes a second correlation between a second portion of the received signal evolution and a second portion of the group representative signal. In this embodiment, the second portion of the received signal evolution is a more complete representation of the received signal evolution than the first portion of the received signal evolution, and the second portion of the group representative signal is a more complete representation of the group representative signal than the first portion of the group representative signal. The relationship of the size of the second portion of the received signal evolution to the complete received signal evolution may be varied dynamically. The relationship of the size of the second portion of the group representative signal to the complete group representative may also be varied dynamically. Performing a first correlation on a first, smaller portion of a signal evolution and then performing a second correlation on a second, more complete portion of the signal evolution facilitates reducing matching time even further when compared to conventional systems.

In one embodiment, matching logic 690 dynamically chooses a matching approach. The matching approach may be chosen based, at least in part, on the number of groups in the pruned group set, the ratio of the number of signal evolutions in the grouped set that have not been grouped to the number of signal evolutions that have been grouped, the compression level within a group in the grouped set, the redundancy level across mean group signals in the grouped set, the distribution of signal evolutions across the grouped set, or the distribution of signal evolutions across the pruned grouped set. In other embodiments, the choice of a matching approach may be based on other factors.

Parameter mapping logic 695 generates a parameter map based on the quantitative parameters. The parameter map may be based on some of the quantitative parameters, or all of the quantitative parameters determined by matching logic 690. The parameter map may be displayed by a display logic, or may be stored.

Figure 8:
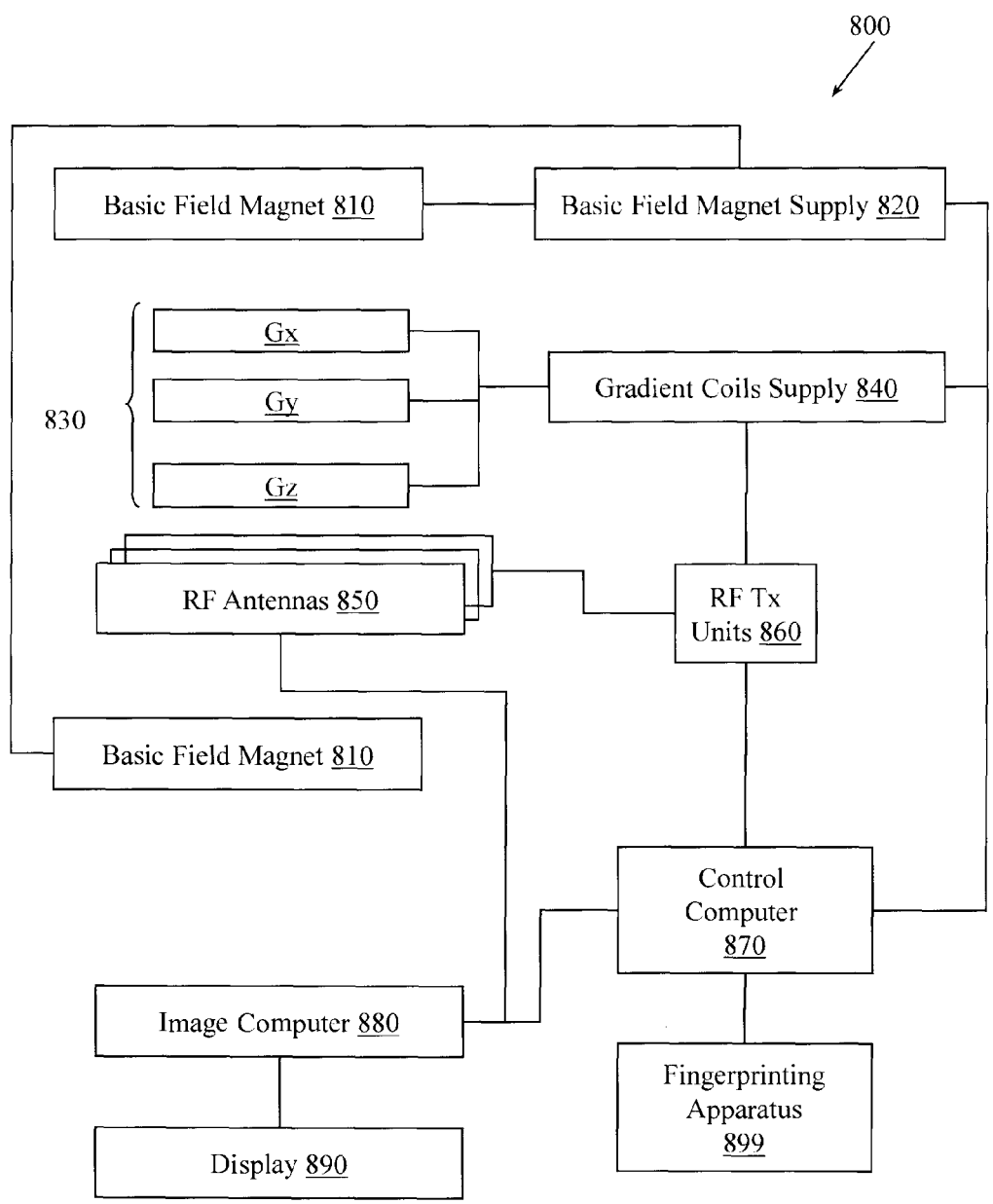
FIG. 8 illustrates an example MRI system in which example methods and apparatus may operate.

FIG. 8 illustrates an example MR apparatus 800 having a fingerprinting apparatus 899 that facilitates MRF associated with fast group matching for generating quantitative parameter maps. The fingerprinting apparatus 899 may be configured with elements of example apparatus described herein or may perform example methods described herein. While fingerprinting apparatus 899 is illustrated as part of MR apparatus 800, in one example, fingerprinting apparatus 899 may be a separate apparatus or apparatuses.

In one embodiment, fingerprinting apparatus 899 may include a collection logic that collects a received signal evolution from a tissue experiencing NMR in response to an MRF excitation applied to the tissue by the MRI apparatus 800. Fingerprinting apparatus 899 may also include a data store that stores a set of MRF signal evolutions. The signal evolutions may be like those described in the MRF dictionary signal equations. Unlike conventional systems, members of the set may be grouped according to correlations between members. Information concerning the composition of the tissue with respect to the two or more resonant species is retrievable using a matched signal evolution. The fingerprinting apparatus 899 may also include a selection logic that selects a matching member of the set that is most closely related to the signal evolution and establishes the matching member as the matched signal evolution. Fingerprinting apparatus 899 may also include a characterization logic that identifies a category for the tissue based, at least in part, on the composition of the tissue as identified using the matched signal evolution. The characterization logic may identify the category for the tissue using a quantitative magnetic resonance based approach. The category for the tissue may distinguish cancerous tissue from healthy tissue or may distinguish tissue exhibiting T1 and T2 parameters, or other parameters that have values within a range, from tissue exhibiting T1 and T2 parameters, or other parameters that are outside the range.

The apparatus 800 includes a basic field magnet(s) 810 and a basic field magnet supply 820. Ideally, the basic field magnets 810 would produce a uniform B0 field. However, in practice, the B0 field may not be uniform, and may vary over an object being analyzed by the MR apparatus 800. MR apparatus 800 may include gradient coils 830 that emit gradient magnetic fields like $G_S$, $G_P$ and $G_R$. The gradient coils 830 may be controlled, at least in part, by a gradient coils supply 840. In some examples, the timing, strength, and orientation of the gradient magnetic fields may be controlled, and thus selectively adapted, during an MR procedure.

MR apparatus 800 may include a set of RF antennas 850 that generate RF pulses and receive resulting NMR signals from an object to which the RF pulses are directed. In some examples, how the pulses are generated and how the resulting MR signals are received may be controlled and thus may be selectively adapted during an MR procedure. Separate RF transmission and reception coils can be employed. The RF antennas 850 may be controlled, at least in part, by a set of RF transmission units 860. An RF transmission unit 860 may provide a signal to an RF antenna 850.

The gradient coils supply 840 and the RF transmission units 860 may be controlled, at least in part, by a control computer 870. In one example, the control computer 870 may be programmed to control an NMR device as described herein. Conventionally, the MR signals received from the RF antennas 850 can be employed to generate an image and thus may be subject to a transformation process like a two dimensional FFT that generates pixilated image data. The transformation can be performed by an image computer 880 or other similar processing device. The image data may then be shown on a display 890.

Fingerprinting apparatus 899 facilitates not having to do conventional reconstruction of an image from MR signals received from the RF antennas 850. Thus the RF energy applied to an object by apparatus 800 need not be constrained to produce signals with substantially constant amplitudes or phases. Instead, fingerprinting apparatus 899 facilitates matching received signals to known signals for which a reconstruction, relaxation parameter, or other information is already available. Received signals and known signals may include complex values with arbitrary phase relationships.

While FIG. 8 illustrates an example MR apparatus 800 that includes various components connected in various ways, it is to be appreciated that other MR apparatus may include other components connected in other ways.

Figure 9:
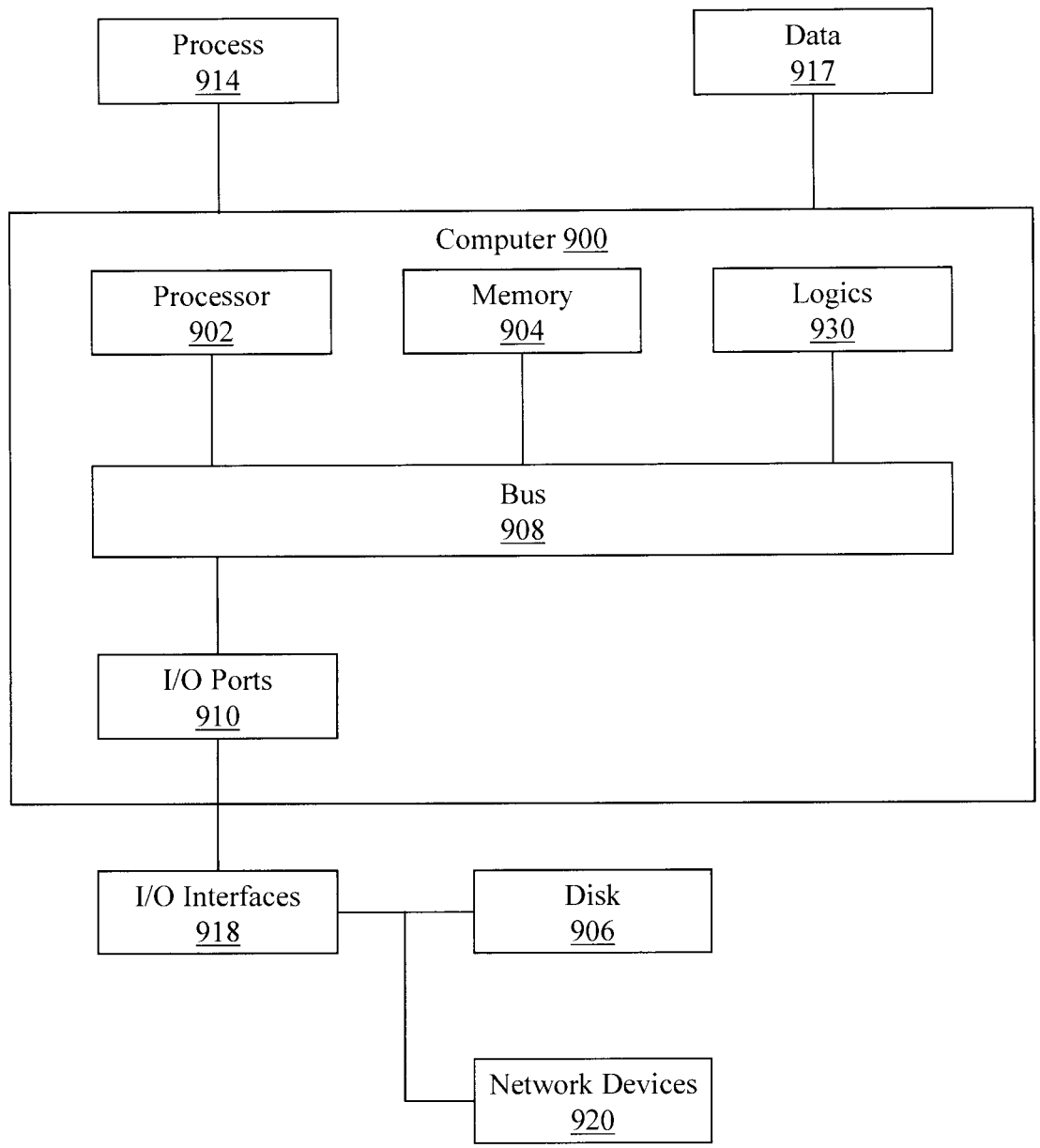
FIG. 9 illustrates an example computer in which example methods and apparatus may operate.

FIG. 9 illustrates an example computer 900 in which example methods illustrated herein can operate and in which example logics may be implemented. In different examples, computer 900 may be part of an MRF system, an MRI system, or may be operably connectable to an MRI system.

Computer 900 includes a processor 902, a memory 904, and input/output ports 910 operably connected by a bus 908. In one example, computer 900 may include a set of logics 930 that perform a method of generating a quantitative parameter map based on signals acquired using MRF. Thus, the set of logics 930, whether implemented in computer 900 as hardware, firmware, software, and/or a combination thereof may provide means (e.g., hardware, software) for generating a quantitative parameter map based on signals acquired using MRF. In different examples, the set of logics 930 may be permanently and/or removably attached to computer 900. In one embodiment, the functionality associated with the set of logics 930 may be performed, at least in part, by hardware logic components including, but not limited to, field-programmable gate arrays (FPGAs), application specific integrated circuits (ASICs), application specific standard products (ASSPs), system on a chip systems (SOCs), or complex programmable logic devices (CPLDs). In one embodiment, individual members of the set of logics 930 are implemented as ASICs or SOCs.

Processor 902 can be a variety of various processors including dual microprocessor and other multi-processor architectures. Memory 904 can include volatile memory and/or non-volatile memory. A disk 906 may be operably connected to computer 900 via, for example, an input/output interface (e.g., card, device) 918 and an input/output port 910. Disk 906 may include, but is not limited to, devices like a magnetic disk drive, a tape drive, a Zip drive, a flash memory card, or a memory stick. Furthermore, disk 906 may include optical drives like a CD-ROM or a digital video ROM drive (DVD ROM). Memory 904 can store processes 914 or data 917, for example. Disk 906 or memory 904 can store an operating system that controls and allocates resources of computer 900.

Bus 908 can be a single internal bus interconnect architecture or other bus or mesh architectures. While a single bus is illustrated, it is to be appreciated that computer 900 may communicate with various devices, logics, and peripherals using other busses that are not illustrated (e.g., PCIE, SATA, Infiniband, 1394, USB, Ethernet).

Computer 900 may interact with input/output devices via I/O interfaces 918 and input/output ports 910. Input/output devices can include, but are not limited to, digital whole slide scanners, an optical microscope, a keyboard, a microphone, a pointing and selection device, cameras, video cards, displays, disk 906, network devices 920, or other devices. Input/output ports 910 can include but are not limited to, serial ports, parallel ports, or USB ports.

Computer 900 may operate in a network environment and thus may be connected to network devices 920 via I/O interfaces 918 or I/O ports 910. Through the network devices 920, computer 900 may interact with a network. Through the network, computer 900 may be logically connected to remote computers. The networks with which computer 900 may interact include, but are not limited to, a local area network (LAN), a wide area network (WAN), or other networks.

References to "one embodiment", "an embodiment", "one example", and "an example" indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable storage medium", as used herein, refers to a non-transitory medium that stores instructions or data. "Computer-readable storage medium" does not refer to propagated signals. A computer-readable storage medium may take forms, including, but not limited to, non-volatile media, and volatile media. Non-volatile media may include, for example, optical disks, magnetic disks, tapes, and other media. Volatile media may include, for example, semiconductor memories, dynamic memory, and other media. Common forms of a computer-readable storage medium may include, but are not limited to, a floppy disk, a flexible disk, a hard disk, a magnetic tape, other magnetic medium, an application specific integrated circuit (ASIC), a compact disk (CD), other optical medium, a random access memory (RAM), a read only memory (ROM), a memory chip or card, a memory stick, and other media from which a computer, a processor or other electronic device can read.

"Logic", as used herein, includes but is not limited to hardware, firmware, software in execution on a machine, or combinations of each to perform a function(s) or an action(s), or to cause a function or action from another logic, method, or system. Logic may include a software controlled microprocessor, a discrete logic (e.g., ASIC), an analog circuit, a digital circuit, a programmed logic device, a memory device containing instructions, and other physical devices. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

To the extent that the term "includes" or "including" is employed in the detailed description or the claims, it is intended to be inclusive in a manner similar to the term "comprising" as that term is interpreted when employed as a transitional word in a claim.

Throughout this specification and the claims that follow, unless the context requires otherwise, the words 'comprise' and 'include' and variations such as 'comprising' and 'including' will be understood to be terms of inclusion and not exclusion. For example, when such terms are used to refer to a stated integer or group of integers, such terms do not imply the exclusion of any other integer or group of integers.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

While example systems, methods, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and other embodiments described herein. Therefore, the invention is not limited to the specific details, the representative apparatus, and illustrative examples shown and described. Thus, this application is intended to embrace alterations, modifications, and variations that fall within the scope of the appended claims.

What is claimed is:

1. A non-transitory computer-readable storage medium storing computer executable instructions that when executed by a computer control the computer to perform a method for producing a quantitative parameter map, comprising:

accessing a comprehensive dictionary of predicted magnetic resonance fingerprinting (MRF) signal evolutions, where a signal evolution includes complex values with an arbitrary phase relationship;

generating a grouped dictionary based on the comprehensive dictionary, where the grouped dictionary includes a plurality of groups, where a group includes a plurality of correlated signal evolutions, a group representative signal that represents the group, and a group low-rank representative;

accessing patient data, where the patient data includes a patient MRF signal evolution, where the patient MRF signal evolution includes complex values with an arbitrary phase relationship;

comparing the patient MRF signal evolution with the group representative signal from a threshold number of the plurality of groups;

upon determining that the group representative signal from the threshold number does not match the patient MRF signal evolution to within a desired threshold,
generating a pruned dictionary by removing from consideration, from the grouped dictionary, the groups represented by the threshold number of representative signals that do not match the patient MRF signal evolution;

selecting a matched signal evolution by matching, to within a threshold quality of fit, the patient MRF signal evolution with a signal evolution in the pruned dictionary, where the matching is based on the group low-rank representative, where the threshold quality of fit is a dynamic, adaptive threshold;

determining a quantitative parameter for the patient MRF signal evolution based on the matched signal evolution; and generating a patient image based, at least part, on the quantitative parameter.

2. The non-transitory computer-readable storage medium of claim 1, where generating the grouped dictionary comprises:

selecting a first MRF signal evolution from the comprehensive dictionary;
defining a group based on the first MRF signal evolution, where the group includes the first MRF signal evolution;
comparing the first MRF signal evolution with a second, different MRF signal evolution selected from the comprehensive dictionary;
upon determining that the second MRF signal evolution is within a threshold correlation of the first MRF signal evolution,
assigning the second MRF signal evolution to the group;
upon determining that the second MRF signal evolution is not within the threshold correlation of the first MRF signal evolution,
selecting a different MRF signal evolution from the comprehensive dictionary to compare with the first signal;
generating a group representative signal for the group; and
computing a group low-rank representative for the group, based, at least in part, on a PCA approach using singular value decomposition.

3. The non-transitory computer-readable storage medium of claim 1, the method comprising identifying one or more MR parameters associated with a voxel in the patient image that produced the patient MRF signal evolution based, at least in part, on the quantitative parameter.

4. The non-transitory computer-readable storage medium of claim 3, where the one or more MR parameters include longitudinal relaxation time T1, transverse relaxation time T2, main magnetic field map B0, or proton density $\rho$.

5. The non-transitory computer-readable storage medium of claim 2, where determining that the second MRF signal evolution is within a threshold correlation of the first MRF signal evolution is a function of sparse methods including K-way partitioning, or greedy choice grouping.

6. The non-transitory computer-readable storage medium of claim 2, where generating the group representative signal for the group includes calculating the mean signal across the plurality of correlated signal evolutions in the group, or calculating a statistics-based estimation from the plurality of correlated signal evolutions in the group.

7. The non-transitory computer-readable storage medium of claim 2, where the grouped dictionary includes all the elements of the comprehensive dictionary, or a subset of the elements of the comprehensive dictionary, where the size of the subset is based, at least in part, on a stopping criterion.

8. The non-transitory computer-readable storage medium of claim 2, where selecting the first MRF signal evolution from the comprehensive dictionary includes randomly selecting an MRF signal evolution from the comprehensive dictionary, or selecting a mean signal evolution for a tissue type.

9. The non-transitory computer-readable storage medium of claim 2, where the grouped dictionary includes a number M of MRF signal evolutions, where M is an integer greater than 1, and where the M MRF signal evolutions are evenly spread across a number N groups, where N is an integer greater than 0.

10. The non-transitory computer-readable storage medium of claim 2, where the grouped dictionary includes a number M of MRF signal evolutions, where M is an integer greater than 1, and where the M MRF signal evolutions are spread unevenly across a number N groups, where N is an integer greater than 0.

11. The non-transitory computer-readable storage medium of claim 1, where generating the pruned dictionary is a function of a pruning criterion, where the pruning criterion is determined through a relative correlation threshold or an absolute correlation threshold.

12. The non-transitory computer-readable storage medium of claim 11, where the pruning criterion is a dynamic, adaptive pruning criterion based, at least in part, on a dynamic best option correlation between the patient MRF signal evolution and a group representative signal evolution, the level of redundancy across the group representative signals in the grouped dictionary, the level of compression within groups in the pruned dictionary, or the level of compression within groups in the grouped dictionary.

13. The non-transitory computer-readable storage medium of claim 12, where the pruning criteria is a relative pruning criteria of $5\times10^{-3}$ below a best group match for the patient MRF signal evolution.

14. A method for generating a pruned dictionary for matching signals acquired using magnetic resonance fingerprinting (MRF), comprising:
accessing a grouped MRF signal dictionary that stores signals characterized by MRF dictionary signal equations, where a group in the grouped MRF signal dictionary includes a plurality of MRF signal evolutions having a threshold correlation, a representative signal evolution, and a low-rank representative;
acquiring a patient MRF signal evolution from an MRF apparatus that repetitively and variably samples a space associated with human tissue to produce the MRF signal;
computing a correlation between the patient MRF signal evolution and the representative signal evolution of a given group; and
upon determining that the correlation between patient MRF signal evolution and the representative signal evolution is not within a threshold correlation:
generating a pruned group dictionary by removing from consideration the group associated with the representative signal evolution from the grouped MRF signal dictionary; and
generating an image using the MRF signal evolutions and correlation information determined using the pruned group dictionary.

15. The method of claim 14, where generating the pruned group dictionary comprises:
computing a correlation between the patient MRF signal evolution and a threshold number of representative signal evolutions, where the threshold number of representative signal evolutions is greater than one;
upon determining that the correlation between patient MRF signal evolution and the threshold number of representative signal evolutions is not within a threshold correlation:
generating a pruned group dictionary by removing from consideration the groups associated with the threshold number of representative signal evolutions from the grouped MRF signal dictionary.

16. The method of claim 15, comprising automatically dynamically adapting the threshold correlation based, at least in part, on the distribution of MRF signal evolutions in the grouped MRF signal dictionary, the distribution of signals in the pruned group dictionary, the number of groups in the grouped MRF dictionary, the number of groups in the pruned group dictionary, the redundancy across the representative signal evolutions in the grouped MRF dictionary, the level of compression within groups in the grouped MRF dictionary, or the number of representative signal evolutions already compared with the patient MRF signal evolution.

17. The method of claim 16, comprising:
applying a principal component analysis (PCA) projection to the pruned group dictionary;
determining, based, at least in part, on the PCA projection, a quantitative parameter by comparing the patient MRF signal evolution with MRF signal evolutions in the pruned group dictionary that match the patient MRF signal evolution to within a threshold; and
identifying one or more MR parameters associated with the sampled space that produced the patient MRF signal evolution based, at least in part, on the quantitative parameter.

18. An apparatus for fast group matching using magnetic resonance fingerprinting (MRF) reconstruction, comprising:
a processor,
a memory,
a data store that stores a grouped set of MRF signal evolutions, where the grouped set includes a plurality of groups, where a member of the plurality of groups includes a set of correlated MRF signal evolutions, a group-representative signal, and a low-rank representative;
a set of logics, and
an interface that connects the processor, the memory, the data store, and the set of logics, the set of logics including:
a collection logic that collects a received signal evolution from a tissue experiencing nuclear magnetic resonance (NMR) in response to an MRF excitation applied to the tissue by a magnetic resonance imaging (MRI) apparatus;
a correlation logic that computes a first correlation between a first portion of the received signal evolution and a first portion of a group representative signal;
a pruning logic that generates a pruned grouped set by, upon determining that the correlation is not within a threshold correlation level, removing the group associated with the group representative signal from the grouped set; and
a matching logic that determines matching quantitative parameters in the pruned grouped set based on the received signal evolution and the low-rank representative for one or more quantitative parameters associated with a voxel of an image of a subject that produced the MRF signal evolutions.

19. The apparatus of claim 18, the set of logics including a clustering logic that:
accesses a set of signal evolutions,
computes a correlation strength between the signal evolutions,
clusters, within a group, signal evolutions based on the correlation strength,
calculates a representative signal for the group,
assigns the representative signal to the group, and
computes a low-rank representative for the group by applying a principal component analysis (PCA)-based projection to signal evolutions in the group.

20. The apparatus of claim 19, where the correlation logic computes a second correlation between a second portion of the received signal evolution and a second portion of the group representative signal, where the second portion of the received signal evolution is a more complete representation of the received signal evolution than the first portion of the received signal evolution, and where the second portion of the group representative signal is a more complete representation of the group representative signal than the first portion of the group representative signal.

21. The apparatus of claim 20, where the matching logic dynamically chooses a matching approach based, at least in part, on the number of groups in the pruned group set, the ratio of the number of signal evolutions in the grouped set that have not been grouped to the number of signal evolutions that have been grouped, the compression level within a group in the grouped set, the redundancy level across mean group signals in the grouped set, the distribution of signal evolutions across the grouped set, or the distribution of signal evolutions across the pruned grouped set.

22. The apparatus of claim 18, the set of logics including a parameter mapping logic that that generates a parameter map based on the quantitative parameters.

23. The apparatus of claim 19, where the clustering logic calculates the representative signal for the group using sparse methods or a greedy choice method.

24. The apparatus of claim 18 where the quantitative parameters include longitudinal relaxation time T1, transverse relaxation time T2, main magnetic field map B0, or proton density $\rho$.

25. The apparatus of claim 18, where the members of the grouped set of MRF signal evolutions are described by the MRF dictionary signal equations and where the received signal evolution is described by the MRF dictionary signal equations.

* * * * *